United States Patent
Leitgeb et al.

(10) Patent No.: US 10,165,685 B2
(45) Date of Patent: Dec. 25, 2018

(54) PRINTED CIRCUIT BOARD

(71) Applicant: AT&S AUSTRIA TECHNOLOGIE & SYSTEMTECHNIK AKTIENGESELLSCHAFT, Leoben (AT)

(72) Inventors: Markus Leitgeb, Trofaiach (AT); Johannes Stahr, St. Lorenzen (AT)

( * ) Notice: Subject to any disclaimer, the term of this patent is extended or adjusted under 35 U.S.C. 154(b) by 0 days.

(21) Appl. No.: 15/505,144

(22) PCT Filed: Aug. 5, 2015

(86) PCT No.: PCT/EP2015/068032
§ 371 (c)(1),
(2) Date: Feb. 20, 2017

(87) PCT Pub. No.: WO2016/026700
PCT Pub. Date: Feb. 25, 2016

(65) Prior Publication Data
US 2017/0238422 A1 Aug. 17, 2017

(30) Foreign Application Priority Data

Aug. 20, 2014 (EP) .................................... 14181577

(51) Int. Cl.
| | |
|---|---|
| H05K 1/16 | (2006.01) |
| H01F 7/02 | (2006.01) |
| H01F 27/28 | (2006.01) |
| H04R 9/02 | (2006.01) |
| H05K 1/03 | (2006.01) |
| H05K 1/02 | (2006.01) |

(52) U.S. Cl.
CPC ............... *H05K 1/165* (2013.01); *H01F 7/02* (2013.01); *H01F 27/2804* (2013.01); *H04R 9/025* (2013.01); *H05K 1/0353* (2013.01); *B81B 2201/0257* (2013.01); *H05K 1/0233* (2013.01); *H05K 2201/0141* (2013.01); *H05K 2201/0154* (2013.01); *H05K 2201/086* (2013.01); *H05K 2201/10083* (2013.01)

(58) Field of Classification Search
CPC ............. H05K 1/165; H05K 2201/086; H05K 2201/083; H04R 9/025; H01F 7/02
See application file for complete search history.

(56) References Cited

U.S. PATENT DOCUMENTS

| | | | | |
|---|---|---|---|---|
| 5,412,366 | A * | 5/1995 | Ohji | H01F 17/0006 336/120 |
| 5,597,643 | A * | 1/1997 | Weber | H01L 21/4857 174/255 |
| 6,324,067 | B1 * | 11/2001 | Nishiyama | H05K 1/165 174/262 |
| 6,565,382 | B1 * | 5/2003 | Blodgett | H01F 27/263 336/200 |

(Continued)

*Primary Examiner* — Chau N Nguyen
*Assistant Examiner* — Roshn Varghese
(74) *Attorney, Agent, or Firm* — Eversheds Sutherland (US) LLP

(57) ABSTRACT

In a printed circuit board (1) comprising a plurality of insulating layers and conductive layers, and comprising at least one cavity (7) at least one electromagnetic coil (8) is arranged on an outer layer (4) of the printed circuit board (1) and cooperates with a permanent magnet (6) arranged inside the at least one cavity (7).

13 Claims, 3 Drawing Sheets

(56) References Cited

U.S. PATENT DOCUMENTS

| | | | | |
|---|---|---|---|---|
| 8,446,243 B2* | 5/2013 | Strzalkowski | ...... | H01F 17/0013 257/531 |
| 2002/0025838 A1* | 2/2002 | Kawamura | ............. | G08B 6/00 455/567 |
| 2005/0231316 A1* | 10/2005 | Sato | ...................... | H01F 27/255 336/212 |
| 2009/0237899 A1* | 9/2009 | Furnival | ........... | H01L 23/49816 361/761 |
| 2011/0140824 A1* | 6/2011 | Herhold | ............. | H01F 27/2804 336/200 |
| 2014/0266505 A1* | 9/2014 | Meyer | ..................... | H03H 7/09 333/175 |
| 2015/0101854 A1* | 4/2015 | Lee | .................... | H01F 27/2804 174/260 |

* cited by examiner

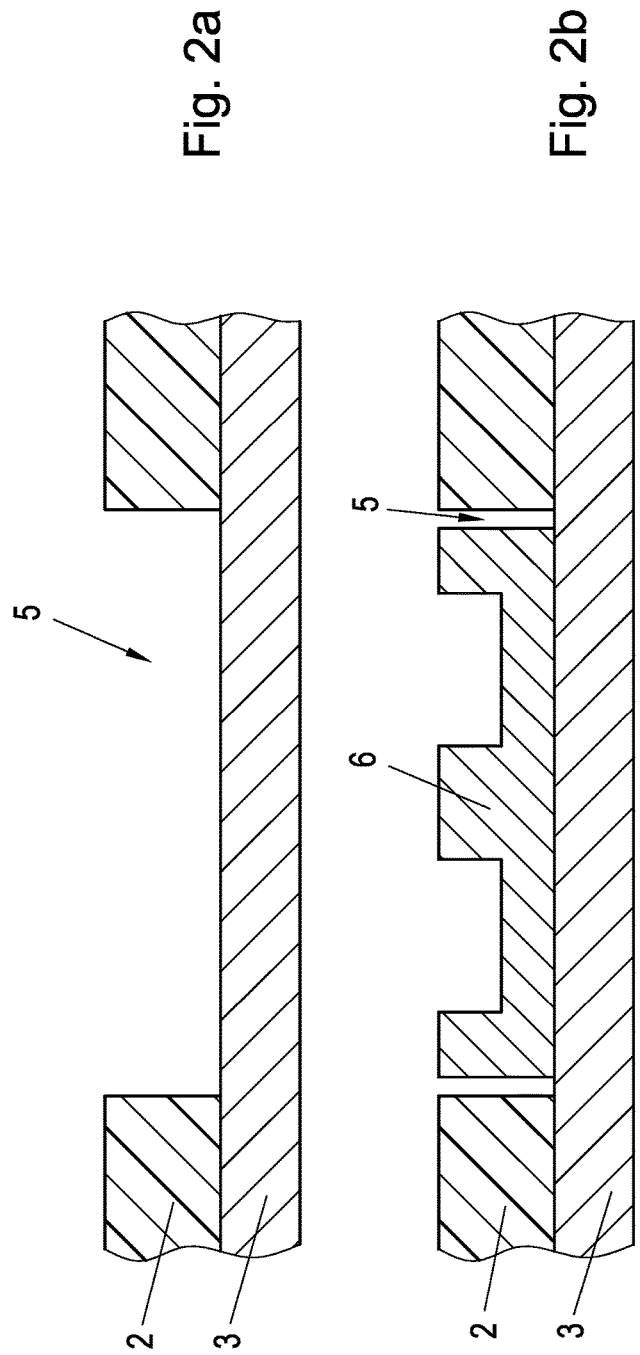

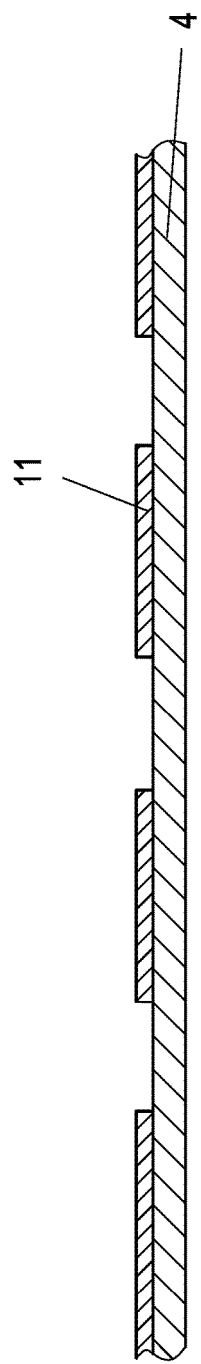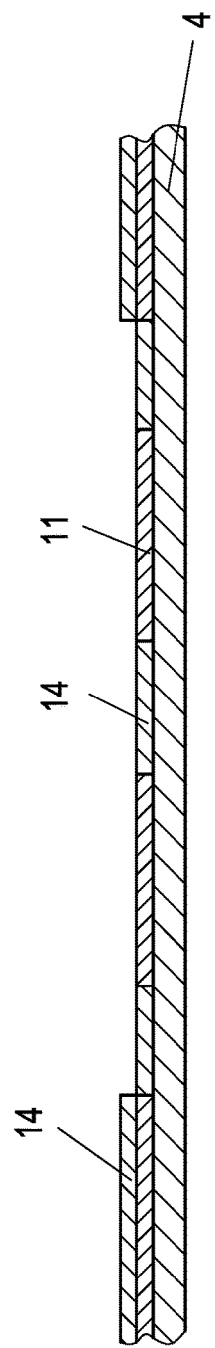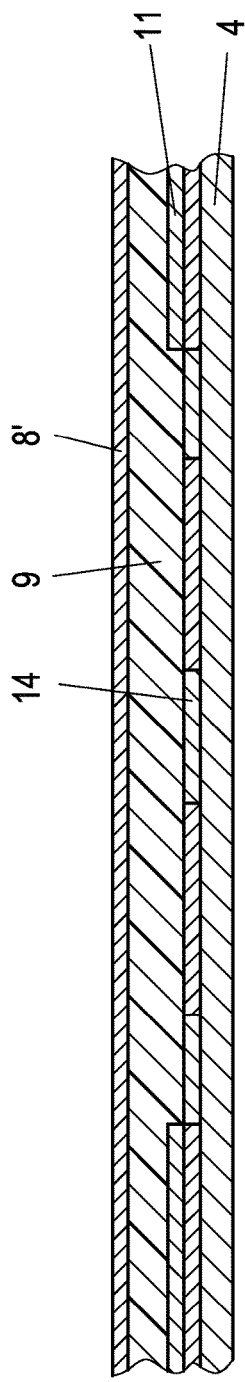

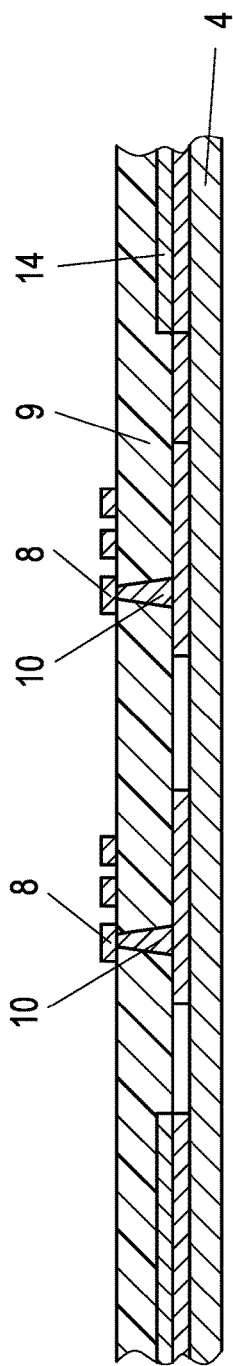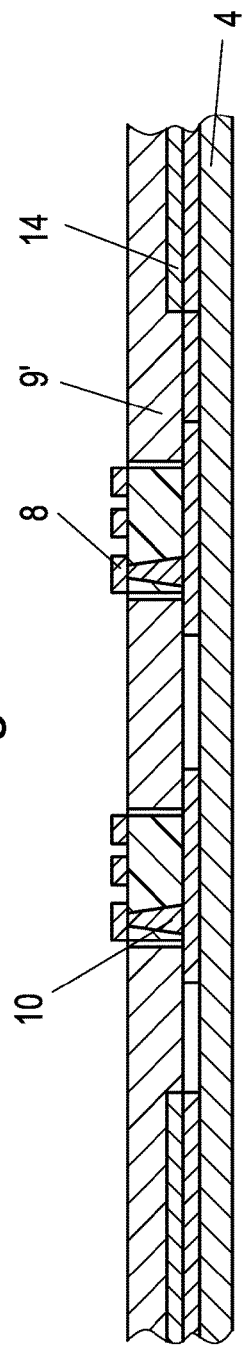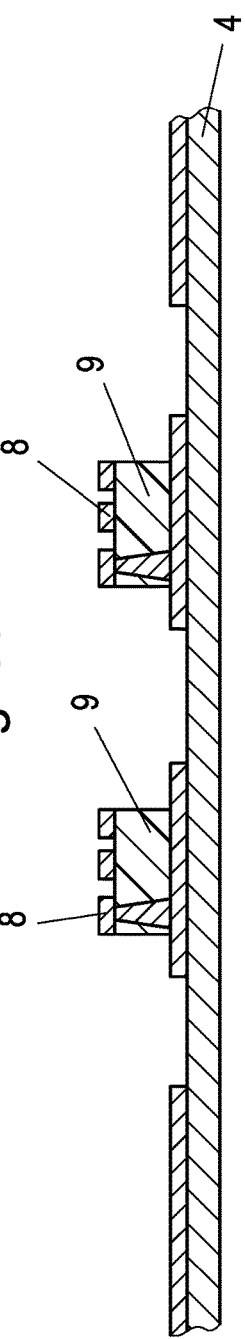

PRINTED CIRCUIT BOARD

BACKGROUND OF THE INVENTION

Field of the Invention

The invention relates to a printed circuit board comprising a plurality of insulating layers and conductive layers, and comprising at least one cavity.

Description of the Related Art

Printed circuit boards, also referred to as printed wire boards, are panels carrying and electrically connecting electronic components such as transistors and the like and, hence, form vital parts of electronic devices. Printed Circuit boards have a more or less complex structure depending on the specific application. In general a printed circuit board comprises a plurality of alternately applied conductive and insulating layers and the conductive layers are bonded together by hardening panels or plies of glass fibers impregnated with organic resin, said panels forming the insulating layers. Such panels for use in the production of printed circuit boards are widely known in the industry as "prepregs" (preimpregnated fibres), which are delivered and processed in an uncured, hence viscous state of the organic resin. The actual insulating layer results when the organic resin has cured. The insulating layers carry conductive layers, for example formed of copper foil, the conductive layers being appropriately processed to form wirings to electrically connect the electronic components. While insulating layers are mostly continuous to provide electric insulation between the conductive layers of the printed circuit board, the conductive layers are usually strongly patterned and open work. Modern printed circuit boards allow for a high degree of integration of electronic components and their appropriate wiring. In the technical field of printed wire boards, substrates are known to offer similar functionality in terms of alternately applied conductive and insulating layers, however, substrates are much smaller and often serve to connect a microchip to a printed circuit board. To this end, the insulating layers of substrates are often produced of glass or ceramic materials which allows for smaller, high-precision structures.

There is, however, a constant need for further miniaturization in the electronic industry in order to provide consumers and professionals with ever smaller yet more capable electronic devices and installations which require more electronic components to be packaged and wired in a smaller space. There are a number of applications that use cavities arranged in a printed circuit board, offering the possibility to arrange electronic components therein. Especially components such as microphones and loudspeakers consume considerable space on a printed circuit board and there is, thus, the need to provide such functionalities on a printed circuit board without mounting such components on the surface of a printed circuit board.

SUMMARY

In order to further increase the degree of integration of such components into a printed circuit board the invention is thus directed to a printed circuit board forming components such as microphones and loudspeakers within the thickness of the printed circuit board. In addition to the favorably small dimensions required on the printed circuit board to provide these functionalities, the invention provides improved protection to the components thus formed.

DETAILED DESCRIPTION

In particular the invention provides for a printed circuit board of the initially mentioned kind which is characterized in that at least one electromagnetic coil is arranged on an outer layer of the printed circuit board and cooperates with a permanent magnet arranged inside the at least one cavity. A coil and a permanent magnet cooperating with each other form a microphone and/or a loudspeaker when one of the two can vibrate to receive and/or emit sound waves. This ability to move or vibrate is provided by the arrangement of the electromagnetic coil on an outer layer of the printed circuit board, which receives sound waves from the surrounding of the printed circuit board or can emit such waves into the surrounding of the printed circuit board. The person skilled in the art will readily understand that the term "cooperating" in the sense of the present invention means that the permanent magnet is in a position to induce a current in the electromagnetic coil upon relative movement of the components. By the integration of the permanent magnet into the thickness of the printed circuit board, valuable space on the top of the board can be saved and used for mounting other components to the printed circuit board.

Since the microphone or the loudspeaker is arranged within the thickness of the printed circuit board and since it is not necessary to provide any openings for the sound to enter the cavity the invention provides for a microphone or a loudspeaker that is sealed against dust and water and is thus not prone to early malfunction.

According to a preferred embodiment of the present invention the cavity is formed within an insulating layer of the printed circuit board having a thickness of between 200 µm and 300 µm. While it is conceivable that the invention might work also with cavities formed within insulating layers of an even smaller thickness, the inventors have achieved particularly favorable results with these claimed dimensions.

As mentioned before the present invention can also be applied to substrates which are connection systems for electronic components basically in the same way as printed circuit boards, it is however preferred that the insulating layers of the printed circuit board are made from prepreg material, in particular FR4-material.

For ease of production, it is preferred that the electromagnetic coil is a flat coil on an insulating layer contacted to a conductive layer arranged on the inside of the outer layer of the printed circuit board. This preferred embodiment allows for the production of the inventive printed circuit board by methods well known in the art of production of printed circuit board since the flat coil can be formed for example of a copper-clad laminate by photolithography. The production of this preferred embodiment of the present invention will be exemplified in more detail below.

For increased flexibility of the outer layer on which the electromagnetic coil is arranged it is preferred when the outer layer of the printed circuit board on which the electromagnetic coil is arranged is a layer of a membrane-material more flexible than the material of the insulating layers of the printed circuit board.

According to a preferred embodiment of the present invention, the membrane-material is selected from the group consisting of flexible thermoplastic materials, in particular selected from the group comprising of polyimide, polyethyleneterephthalate, polypropylennaphthalate and liquid crystal polymer. These materials offer perfect properties to support the electromagnetic coil and promote vibrating of the same for increased performance of the microphone and/or loudspeaker.

According to a preferred of the present embodiment of the present invention at least one electrode group is glued to the printed circuit board. Gluing the electrode-group to the printed circuit board comprising the at least one cavity can be particularly effective when the insulating layers of the electrode groups are made from the group comprising of polyimide, polyethyleneterephthalate, polypropylennaphthalate and liquid crystal polymer.

According to another preferred embodiment of the present invention the at least one electrode-group is fixed to the printed circuit board by means of a layer of no-flow-prepreg. Securing insulating layers to a semi-finished printed circuit board by means of a no-flow-prepreg is a technique well known in the art of producing printed circuit boards and can thus easily be carried out to realize the present invention.

According to a preferred embodiment of the present invention, the permanent magnet has at least one recess to receive the at least one magnetic coil. Surrounding the coil in a recess of the permanent magnet improves the performance of the inventive printed circuit board in terms of linearity of the microphone and/or loudspeaker and thus reduces the systems distortion factor.

Similarly, the inventive printed circuit board may be devised such that the permanent magnet has two recesses to receive electromagnetic coils as it is in conformity with a preferred embodiment of the present invention. Surrounding the coils in recesses of the permanent magnet improves the performance of the inventive printed circuit board in terms of linearity of the microphone and/or loudspeaker and thus reduces the systems distortion factor.

The present invention in the following is described by way of an exemplary embodiment and with reference to the accompanying drawings in which FIG. 1 shows a sectional side view of a printed circuit board according to the present invention, FIGS. 2a) to 2b) show the production of a cavity within a semi-finished printed circuit board and the arrangement of a permanent magnet within the cavity, and FIGS. 3a) to 3f) show the production of the outer layer carrying the electromagnetic coil.

In FIG. 1, the inventive printed circuit board is denoted by reference numeral 1 and it is basically comprised of a central insulating layer 2, a base layer 3 and an outer layer 4. The central insulating layer 2 comprises a cavity 5, in which a permanent magnet 6 is arranged. The permanent magnet has two recesses 7 to receive the electromagnetic coils 8, which are formed as flat coils etched out of a conductive layer that is arranged on an insulating layer 9. A line 10 contacts each coil to a conductive layer 11 arranged on the inside of the outer layer 4. The conductive layer 11 is appropriately patterned and connected to an electronic system (not shown) for processing the current pulses which result when the outer layer 4 vibrates in the direction of the double-arrow 12 in reaction to incoming sound. On the other hand, when the coil(s) 8 is (are) supplied with appropriate current, the outer layer 4 will vibrate accordingly thereby emitting sound. Hence, the inventive printed circuit board 1 has a built-in microphone/loudspeaker. The outer layer 4 is fixed to the central insulating layer 2 either by gluing or by means of a layer of no-flow-prepreg 13.

Referring now to FIG. 2a), the production of the inventive printed circuit board begins with the central insulating layer 2 and a base layer laminated to each other by techniques well known in the art of the production of printed circuit boards. A cavity 5 is provided within the central insulating layer 2 and a permanent magnet 6 fixed therein (FIG. 2b)).

The outer layer 4 with the electromagnetic coils 8 arranged thereon is produced starting from an outer layer 4, which can be a layer of polyimide having an appropriately patterned conductive layer 11 on one side thereof (FIG. 3a)). The arrangement of FIG. 3a) is covered with a release layer 14 (FIG. 3b)) which is well known in the art. In particular the release layer 14 preferably is formed by materials selected from the group comprised of metal soaps of Al, Mg, Ca, Na and Zn combined with a binding agent and a solvent. In the area of the release layer 14 firm adhesion of additional layers laminated onto the core material as depicted in FIG. 3c) will be prevented. As can be seen in FIG. 3c), it is proceeded to laminate a copper-clad laminate comprised of an insulating layer 9 and a conductive layer 8'. Subsequently, the electromagnetic coils 8 and the lines 10 for contacting them are produced by known techniques of photolithography and via-drilling (FIG. 3d). As can be seen in FIG. 3e), the copper clad laminate is cut and the regions of the insulating layer 9 not carrying the electromagnetic foils 8 are removed FIG. 3f). The element resulting from this procedure and depicted in FIG. 3f) forms the outer layer 4 on which the electromagnetic coils 8 are arranged and can be glued to the arrangement of FIG. 2b) or fixed by using no-flow-prepreg.

The invention claimed is:

1. A printed circuit board (1) comprising:
   a plurality of insulating layers and conductive layers;
   at least one cavity (5) disposed extending between an inner surface of an outer layer (4) and an inner surface of a base layer (3) and within at least one central insulating layer (2);
   a permanent magnet (6) having a base surface disposed on the inner surface of the base layer (3) within the at least one cavity (5) and a top surface opposite the base surface, wherein the permanent magnet has at least one recess (7) in the top surface; and
   at least one electromagnetic coil (8) disposed on the inner surface of the outer layer (4) and extending at least partially into the at least one recess (7),
   wherein the at least one electromagnetic coil (8) and permanent magnet (6) are configured to cooperate with each other to form:
      a microphone wherein the outer layer (4) is configured to vibrate in reaction to incoming sound, or
      a loudspeaker, wherein the outer layer (4) is configured to vibrate in order to produce sound.

2. The printed circuit board of claim 1, wherein the at least one central insulating layer (2) has a thickness of between 200 μm and 1000 μm.

3. The printed circuit board of claim 1, wherein the at least one central insulating layer (2) of the printed circuit board (1) is made from prepreg-material.

4. The printed circuit board of claim 3, wherein the prepreg-material is FR4-material.

5. The printed circuit board of claim 1, wherein the at least one electromagnetic coil (8) is a flat coil on an insulating layer (9) contacted to a conductive layer (11) arranged on the inner surface of the outer layer (4) of the printed circuit board (1).

6. The printed circuit board of claim 1, wherein the outer layer (4) of the printed circuit board (1) on which the at least one electromagnetic coil (8) is arranged is a layer of a membrane-material more flexible than the material of the at least one central insulating layer (2) of the printed circuit board (1).

7. The printed circuit board of claim 6, wherein the membrane-material is a flexible thermoplastic material.

8. The printed circuit board of claim 6, wherein the membrane-material is selected from the group consisting of polyimide, polyethyleneterephthalate, polypropylennaphthalate, and liquid crystal polymer.

9. The printed circuit board of claim 1, wherein the outer layer (4) is glued to the printed circuit board (1).

10. The printed circuit board of claim 1, wherein the outer layer (4) is fixed to the printed circuit board (1) by means of a layer of no-flow-prepreg.

11. The printed circuit board of claim 1, wherein the permanent magnet has two recesses (7) and two electromagnetic coils (8), wherein each of the two electromagnetic coils (8) extends at least partially into its own one of the two recesses (7).

12. The printed circuit board of claim 1, wherein the outer layer (4) is configured to vibrate when the at least one electromagnetic coil (8) is supplied with current.

13. The printed circuit board of claim 1, wherein the at least one electromagnetic coil (8) is surrounded by the recess (5).

\* \* \* \* \*